US012424991B2

(12) United States Patent
Ichihashi et al.

(10) Patent No.: US 12,424,991 B2
(45) Date of Patent: Sep. 23, 2025

(54) CURRENT SOURCE CIRCUIT AND ELECTRONIC DEVICE

(71) Applicant: SONY SEMICONDUCTOR SOLUTIONS CORPORATION, Kanagawa (JP)

(72) Inventors: Masahiro Ichihashi, Kanagawa (JP); Masayuki Katakura, Kanagawa (JP); Kazumasa Nishimura, Kanagawa (JP); Tetsuya Tashiro, Kanagawa (JP); Nobuhiko Shigyo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 399 days.

(21) Appl. No.: 18/001,846

(22) PCT Filed: Apr. 27, 2021

(86) PCT No.: PCT/JP2021/016719
§ 371 (c)(1),
(2) Date: Dec. 14, 2022

(87) PCT Pub. No.: WO2021/261072
PCT Pub. Date: Dec. 30, 2021

(65) Prior Publication Data
US 2023/0261623 A1 Aug. 17, 2023

(30) Foreign Application Priority Data

Jun. 22, 2020 (JP) ................................. 2020-106673

(51) Int. Cl.
*H03F 3/45* (2006.01)
*H03F 3/00* (2006.01)

(52) U.S. Cl.
CPC ......... *H03F 3/45475* (2013.01); *H03F 3/005* (2013.01); *H03F 2203/45551* (2013.01)

(58) Field of Classification Search
CPC ..................................... H03F 3/45; H03F 1/12
USPC ..................................................... 330/252, 51
See application file for complete search history.

(56) References Cited

FOREIGN PATENT DOCUMENTS

| JP | 63-006908 A | 1/1988 |
|---|---|---|
| JP | 2012-503441 A | 2/2012 |
| JP | 2012-503914 A | 2/2012 |
| JP | 2013-074445 A | 4/2013 |

OTHER PUBLICATIONS

International Search Report and Written Opinion of PCT Application No. PCT/JP2021/016719, issued on Jul. 13, 2021, 08 pages of ISRWO.

*Primary Examiner* — Henry Choe
(74) *Attorney, Agent, or Firm* — CHIP LAW GROUP

(57) ABSTRACT

To improve stability of a reference current in a current source circuit that generates the reference current by using capacitors. The current source circuit includes a pair of capacitors, a switching circuit, an operational amplifier, and an output transistor. The switching circuit charges one of the pair of capacitors with a predetermined charging current, and transfers electric charge from the one of the pair of capacitors to the other of the pair of capacitors. The operational amplifier amplifies a difference between the terminal voltage of the other of the pair of capacitors and a predetermined reference voltage and outputs the difference that has been amplified as an output voltage. The output transistor outputs a current corresponding to the output voltage as a reference current.

9 Claims, 12 Drawing Sheets

CURRENT SOURCE CIRCUIT AND ELECTRONIC DEVICE

CROSS REFERENCE TO RELATED APPLICATIONS

This application is a U.S. National Phase of International Patent Application No. PCT/JP2021/016719 filed on Apr. 27, 2021, which claims priority benefit of Japanese Patent Application No. JP 2020-106673 filed in the Japan Patent Office on Jun. 22, 2020. Each of the above-referenced applications is hereby incorporated herein by reference in its entirety.

TECHNICAL FIELD

The present technology relates to a current source circuit. Specifically, the present technology relates to a current source circuit and an electronic device using capacitors.

BACKGROUND ART

Conventionally, in various devices using a constant current, a current source circuit that generates the current as a reference current is provided. As this current source circuit, a resistance type circuit having a configuration in which a transistor and a resistive element are connected in series, and an operational amplifier amplifies a difference between the connection node between them and a constant voltage and feeds back the amplified difference to the gate of the transistor is often used; however, the product variation of resistive elements is greater than that of capacitative elements. Therefore, when high accuracy is required, a switched-capacitor-type current source circuit provided with a switched-capacitor circuit is used instead of the resistive element. However, when the switched-capacitor circuit performs switching operation, a fluctuation (ripple) in voltage of a connection node between the switched-capacitor circuit and an operational amplifier occurs, and the ripple causes an error in a reference current. Therefore, a current source circuit in which a filter circuit including a capacitor and a resistor is added between the connection node and an input terminal of the operational amplifier has been proposed (See, for example, Patent Document 1).

CITATION LIST

Patent Document

Patent Document 1: Japanese Translation of PCT International Application Publication No. 2012-503441

SUMMARY OF THE INVENTION

Problems to be Solved by the Invention

In the above-described conventional technology, the ripple is suppressed by adding a filter circuit. However, in the current source circuit described above, as the capacitance in the filter circuit is increased, the possibility that the operational amplifier oscillates increases, and there is a possibility that the stability of the current source circuit decreases. If the capacitance is reduced, there is no possibility of oscillation; however, the ripple cannot be sufficiently suppressed, which is not preferable.

The present technology has been made in view of such a situation, and an object thereof is to improve the stability of a current source circuit that generates a reference current by using capacitors.

Solution to Problems

The present technology has been made to solve the above-described problems, and a first aspect thereof is a current source circuit including: a pair of capacitors; a switching circuit that charges one of the pair of capacitors with a predetermined charging current and transfers electric charge from the one of the pair of capacitors to the other of the pair of capacitors; an operational amplifier that amplifies the difference between a terminal voltage of the other of the pair of capacitors and a predetermined reference voltage and outputs the difference that has been amplified as an output voltage; and an output transistor that outputs a current corresponding to the output voltage as a reference current. With this arrangement, an effect of improving the stability of the circuit is brought about.

Furthermore, in the first aspect, the switching circuit may further perform control to discharge one of the pair of capacitors. Therefore, the effect of enabling recharge of the capacitor is brought about.

Furthermore, in the first aspect, the switching circuit may alternately perform control to charge the one of the pair of capacitors and control to transfer the electric charge to the other of the pair of capacitors and discharge the one of the pair of capacitors. Therefore, an effect of gradually changing the terminal voltage of the capacitor is brought about.

Furthermore, in the first aspect, a current source transistor that supplies a current corresponding to the output voltage as the charging current may be further included. With this arrangement, an effect of charging the capacitor with the current corresponding to the output voltage of the operational amplifier is brought about.

Furthermore, in the first aspect, the switching circuit may include: a first switch that opens and closes a path between the current source transistor and one of the pair of capacitors; a second switch that opens and closes a path between a predetermined ground terminal and a connection node between the current source transistor and the one of the pair of capacitors; a third switch that opens and closes a path between the pair of capacitors; and a fourth switch that opens and closes a path between the ground terminal and a connection node between the first switch and the one of the pair of capacitors. With this arrangement, an effect of performing charging and discharging of the capacitors and electric charge transfer is brought about.

Furthermore, in the first aspect, a variable resistor connected in series to the output transistor, a comparator that compares a voltage of a connection node between the output transistor and the variable resistor with the reference voltage and outputs a comparison result, and a resistance value control unit that controls a resistance value of the variable resistor on the basis of the comparison result may be further included. With this arrangement, an effect of controlling the resistance value to an optimum value is brought about.

Furthermore, in the first aspect, the resistance value control unit may determine the resistance value obtained when a voltage of the connection node of the variable resistor and the reference voltage substantially match by using a binary search algorithm. As a result, there is no need to keep operating a capacitor circuit, and the current source circuit can be used in a conventional resistance mode, leading to an effect of suppressing a ripple.

Furthermore, a second aspect of the present technology is an electronic device including: a pair of capacitors; a switching circuit that charges one of the pair of capacitors with a predetermined charging current and transfers electric charge from the one of the pair of capacitors to the other of the pair of capacitors; an operational amplifier that amplifies a difference between a terminal voltage of the other of the pair of capacitors and a predetermined reference voltage and outputs the difference that has been amplified as an output voltage; an output transistor that outputs a current corresponding to the output voltage as a reference current; and a reception circuit that receives the reference current and operates. With this arrangement, an effect of improving the stability of the device is brought about.

Furthermore, in the first aspect, the reception circuit may be an integrated digital-to-analog converter. With this arrangement, an effect of improving accuracy is brought about.

MODE FOR CARRYING OUT THE INVENTION

Hereinafter, embodiments for implementing the present technology (hereinafter, referred to as embodiments) will be described. The description will be given in the following order.

1. First Embodiment (example of transferring electric charge between a pair of capacitors)

2. Second Embodiment (example of transferring electric charge between a pair of capacitors and controlling variable resistor)

1. First Embodiment

[Configuration Example of Electronic Device]

Figure 1:
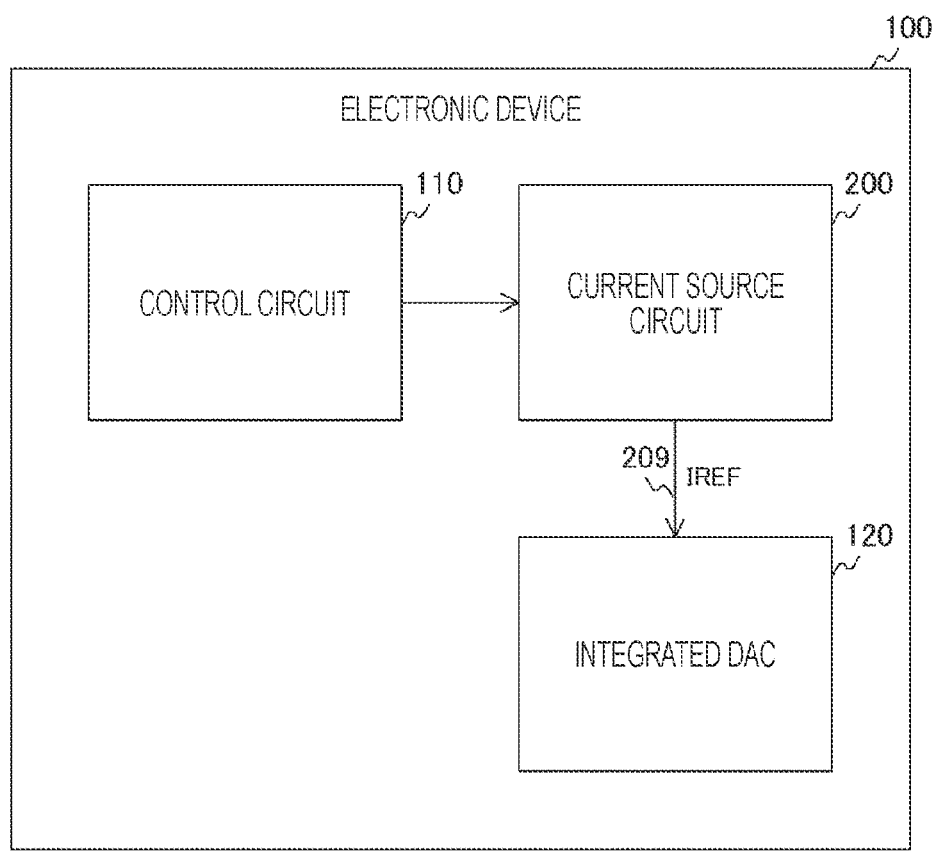
FIG. 1 is a block diagram illustrating a configuration example of an electronic device according to a first embodiment of the present technology.

FIG. 1 is a block diagram illustrating a configuration example of an electronic device 100 according to a first embodiment of the present technology. The electronic device 100 includes a control circuit 110, a current source circuit 200, and an integrated DAC 120.

The control circuit 110 controls the current source circuit 200 to generate a predetermined reference current IREF. The current source circuit 200 generates the reference current IREF and supplies the reference current IREF to the integrated DAC 120 via a signal line 209. The integrated DAC 120 is a reception circuit that receives the reference current IREF and performs digital-to-analog conversion.

Note that although the integrated DAC 120 is provided as a reception circuit that receives the reference current IREF and operates, the present technology is not limited to this configuration, and various reception circuits other than the integrated DAC 120 can be provided. Furthermore, the integrated DAC 120 is an example of the reception circuit described in the claims.

[Configuration Example of Current Source Circuit]

Figure 2:
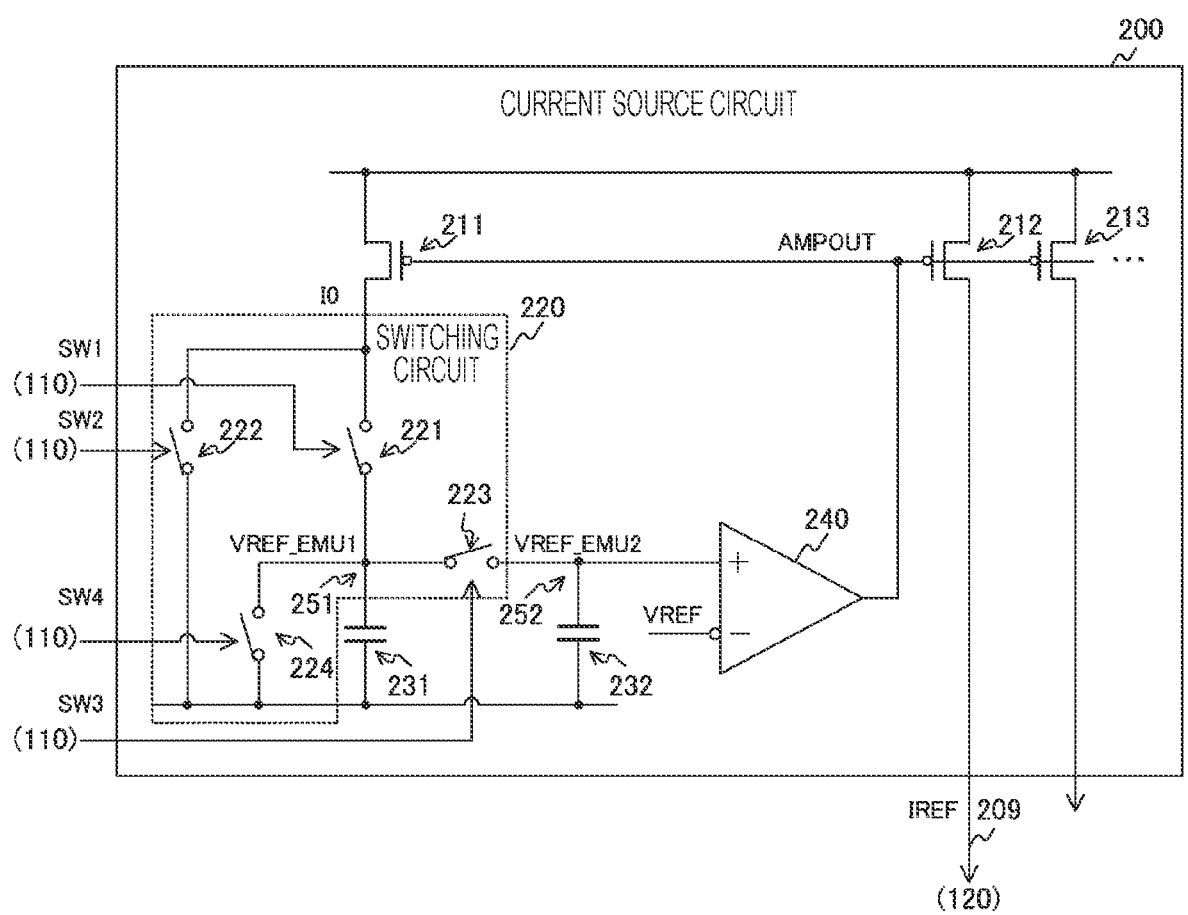
FIG. 2 is a circuit diagram illustrating a configuration example of a current source circuit according to the first embodiment of the present technology.

FIG. 2 is a circuit diagram illustrating a configuration example of the current source circuit 200 according to the first embodiment of the present technology. The current source circuit 200 includes a plurality of p-channel metal oxide semiconductor (pMOS) transistors such as pMOS transistors 211 to 213, a switching circuit 220, capacitors 231 and 232, and an operational amplifier 240. Furthermore, the switching circuit 220 includes switches 221 to 224.

The plurality of pMOS transistors such as the pMOS transistors 211 to 213 is connected in parallel to a power supply terminal. Furthermore, the switch 221 and the capacitor 231 are connected in series between the pMOS transistor 211 and a ground terminal. One end of the capacitor 232 is connected to the ground terminal, and the other end is connected to the switch 223 and a non-inverting input terminal (+) of the operational amplifier 240.

The switch 221 opens and closes a path between the pMOS transistor 211 and the capacitor 231 in accordance with a control signal SW1 from the control circuit 110. The switch 222 opens and closes a path between the ground terminal and a connection node between the pMOS transistor 211 and the switch 221 according to a control signal SW2 from the control circuit 110.

Note that the switches 221 and 222 are examples of a first switch and a second switch described in the claims, respectively.

The switch 223 opens and closes a path between a connection node 251 between the switch 221 and the capacitor 231 and a connection node 252 between the operational amplifier 240 and the capacitor 232 according to a control signal SW3 from the control circuit 110. The switch 224 opens and closes a path between the connection node 251 and the ground terminal according to a control signal SW4 from the control circuit 110. The voltage of the connection node 251 is VREF_EMU1, and the voltage of the connection node 252 is VREF_EMU2.

Note that the switches 223 and 224 are examples of a third switch and a fourth switch described in the claims, respectively.

A voltage obtained by inverting the reference voltage VREF is input to an inverting input terminal (−) of the operational amplifier 240. The reference voltage VREF is a constant voltage generated by a band gap reference (BGR) circuit or the like. Furthermore, the output terminal of the operational amplifier 240 is connected to the gate terminal of each of the plurality of pMOS transistors such as the pMOS transistors 211 to 213. The output voltage of the operational amplifier 240 is referred to as AMPOUT.

With the above-described connection, the output voltage AMPOUT of the operational amplifier 240 becomes a voltage obtained by amplifying the difference between the terminal voltage on the power supply side of the capacitor 232 (that is, the voltage VREF_EMU2 of the connection node 252) and the reference voltage VREF.

The pMOS transistor 211 supplies a current corresponding to the output voltage AMPOUT to the switching circuit 220 as a charging current I0. Note that the pMOS transistor 211 is an example of a current source transistor described in the claims.

The pMOS transistors such as the pMOS transistors 211 and 212 output a current corresponding to the output voltage AMPOUT to various circuits as the reference current IREF. For example, the pMOS transistor 211 outputs the reference current IREF to the integrated DAC 120 via the signal line 209. Note that the pMOS transistors 211 and 212 are examples of an output transistor described in the claims.

Furthermore, the switching circuit 220 performs control to charge and discharge the capacitor 231 and control to transfer electric charge from the capacitor 231 to the capacitor 232 by opening and closing the switches 221 to 224. In the case of charging the capacitor 231, only the switch 221 is in a closed state, and the remaining switches are in an open state. In the case of transferring electric charge from the capacitor 231 to the capacitor 232, the switches 222 and 223 are in the closed state, and the switches 221 and 224 are in the open state. In the case of discharging the capacitor 231, the switches 222 and 224 are in the closed state, and the switches 221 and 223 are in the open state.

Furthermore, the switching circuit 220 periodically performs the control of charging and the control of electric charge transfer and discharging described above alternately. The timing of these controls will be described later in detail.

[Operation Example of Current Source Circuit]

Figure 3:
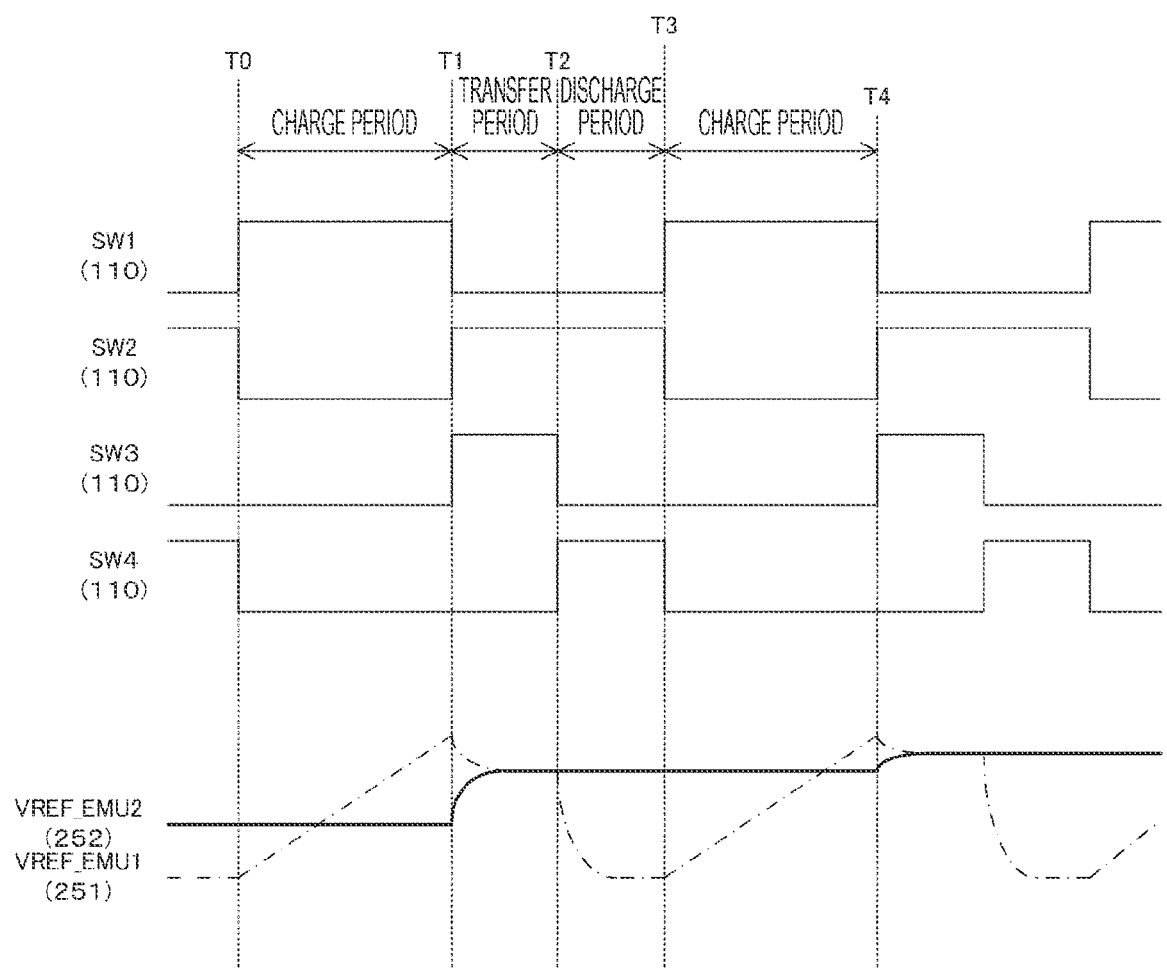
FIG. 3 is a timing chart illustrating an example of operation of the current source circuit according to the first embodiment of the present technology.

FIG. 3 is a timing chart illustrating an example of operation of the current source circuit 200 according to the first embodiment of the present technology. It is assumed that each of the switches 221 to 224 is in the closed state in a case where the corresponding control signal is at a high level, and is in the open state in a case where the corresponding control signal is at a low level.

The control circuit 110 supplies a predetermined periodic signal (such as a clock signal) as the control signal SW1, and supplies a signal obtained by inverting the control signal SW1 as a control signal SW2. Furthermore, in a period in which the control signal SW1 is at the low level, the control circuit 110 supplies, as the control signal SW3, a signal that is at the high level only during a period from a fall of the control signal SW1 to a predetermined time point before a rise thereof. The control circuit 110 supplies, as the control signal SW4, a signal that is at the high level only during a period from a fall of the control signal SW3 to a rise of the control signal SW1.

In a period in which the control signal SW1 is at the high level, such as a period between timings T0 to T1, only the switch 221 is in the closed state, and the remaining switches are in the open state. As a result, the capacitor 231 is charged with the charging current I0. This period is referred to as a charge period.

Furthermore, during a period in which the control signal SW3 is at the high level, such as a period between the timings T1 and T2, the switches 222 and 223 are in the closed state, and the switches 221 and 224 are in the open state. As a result, electric charge accumulated in the capacitor 231 is transferred to the capacitor 232. This period is referred to as a transfer period.

Furthermore, during a period in which the control signal SW4 is at the high level, such as a period between the timings T2 and T3, the switches 222 and 224 are in the closed state, and the switches 221 and 223 are in the open state. As a result, the capacitor 231 is discharged. This period is referred to as a discharge period.

The period between the timings T3 and T4 becomes a charge period, and the capacitor 231 is charged. Hereinafter, similar control is periodically and repeatedly executed.

Furthermore, in FIG. 3, an alternate long and short dash line indicates a change of the voltage VREF_EMU1 of the connection node 251, and a thick line indicates a change of the voltage VREF_EMU2 of the connection node 252. In the charge period, the voltage VREF_EMU1 increases. In the transfer period, the voltage VREF_EMU1 decreases, while the voltage VREF_EMU2 increases, and the values of them become approximately the same. In the discharge period, the voltage VREF_EMU1 decreases. These operations are repeated, and finally, the voltage VREF_EMU1 and the voltage VREF_EMU2 are stabilized at the time point when the voltage VREF_EMU1 and the voltage VREF_EMU2 are at the same level and are at the same level as VREF.

Furthermore, the reference current IREF is expressed by the following formula.

$$IREF = C_0 \cdot (dV/dt)$$

In the above formula, $C_0$ is a capacitance value of the capacitor 231, and the unit is, for example, farad (F). V is a value of the reference voltage VREF, and the unit is, for example, volt (V). "dV/dt" indicates a change amount per unit time of the reference voltage VREF.

As indicated by the alternate long and short dash line, the voltage VREF_EMU1, which is the terminal voltage of the capacitor 231, fluctuates near the timing T1 and the like, and the fluctuation is called a ripple. In contrast, as indicated by the thick line, the voltage VREF_EMU2, which is the terminal voltage of the capacitor 232, increases within the transfer period, and the switch 223 is in the open state until the next transfer, and therefore, the voltage VREF_EMU2 is constant. As described above, since the voltage VREF_EMU2 rises little by little each time electric charge is transferred and then becomes stable, no ripple occurs.

By suppressing the ripple, the error of the reference current IREF caused by the ripple can be reduced, and the accuracy thereof can be improved. By improving the accuracy, voltage reduction of the entire system can be easily achieved. Furthermore, it is not necessary to add a filter circuit in order to suppress the ripple. Since the filter circuit is unnecessary, there is no possibility that the operational amplifier oscillates due to addition of the filter circuit, and the stability of the current source circuit 200 is improved.

Furthermore, in a resistance type current source circuit, it is necessary to calibrate the resistive element in a test so as to correct product variation, and the test cost may increase.

However, in the current source circuit 200 in FIG. 3, since the resistive element is not used, the test cost can be reduced as compared with a resistance type current source circuit.

Furthermore, for secondary effects, the reference current IREF is distributed to every block of a chip in the electronic device 100. Since the design margin of the circuit on the reception side (the integrated DAC 120 or the like) due to variation can be relaxed, the circuit design can be simplified. Furthermore, in a recent submicron process, digital circuits tend to be shrunk, but analog circuits do not benefit from the recent submicron process. However, since the above-described current source circuit 200 uses a clock signal and furthermore, can reduce the voltage, the current source circuit has characteristics of high affinity with a digital system and high contribution in reducing the area.

Figure 4:
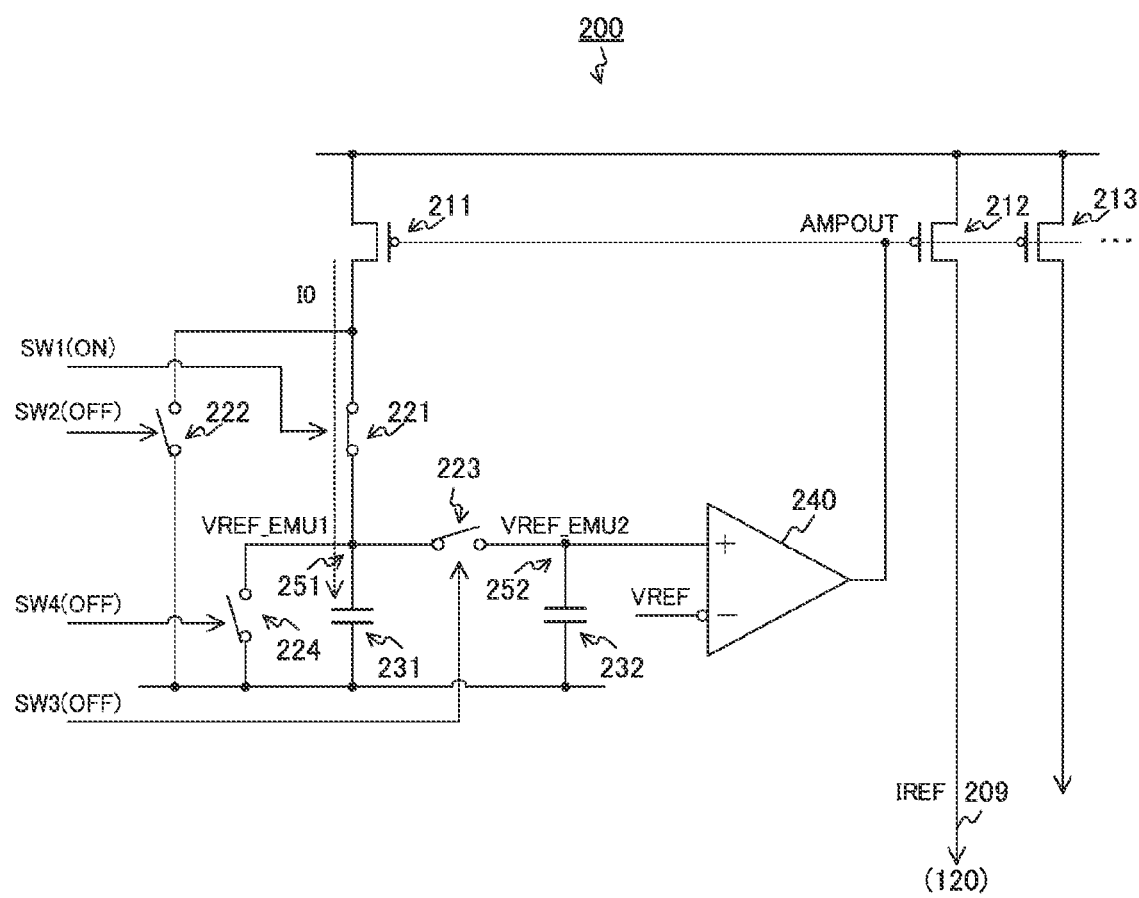
FIG. 4 is a circuit diagram illustrating an example of a state of the current source circuit within a charge period according to the first embodiment of the present technology.

FIG. 4 is a circuit diagram illustrating an example of the state of the current source circuit 200 within the charge period according to the first embodiment of the present technology. As illustrated in FIG. 4, only the switch 221 is in the closed state. As a result, the charging current I0 from the pMOS transistor 211 flows to the capacitor 231 via the switch 221, and the capacitor 231 is charged.

Figure 5:
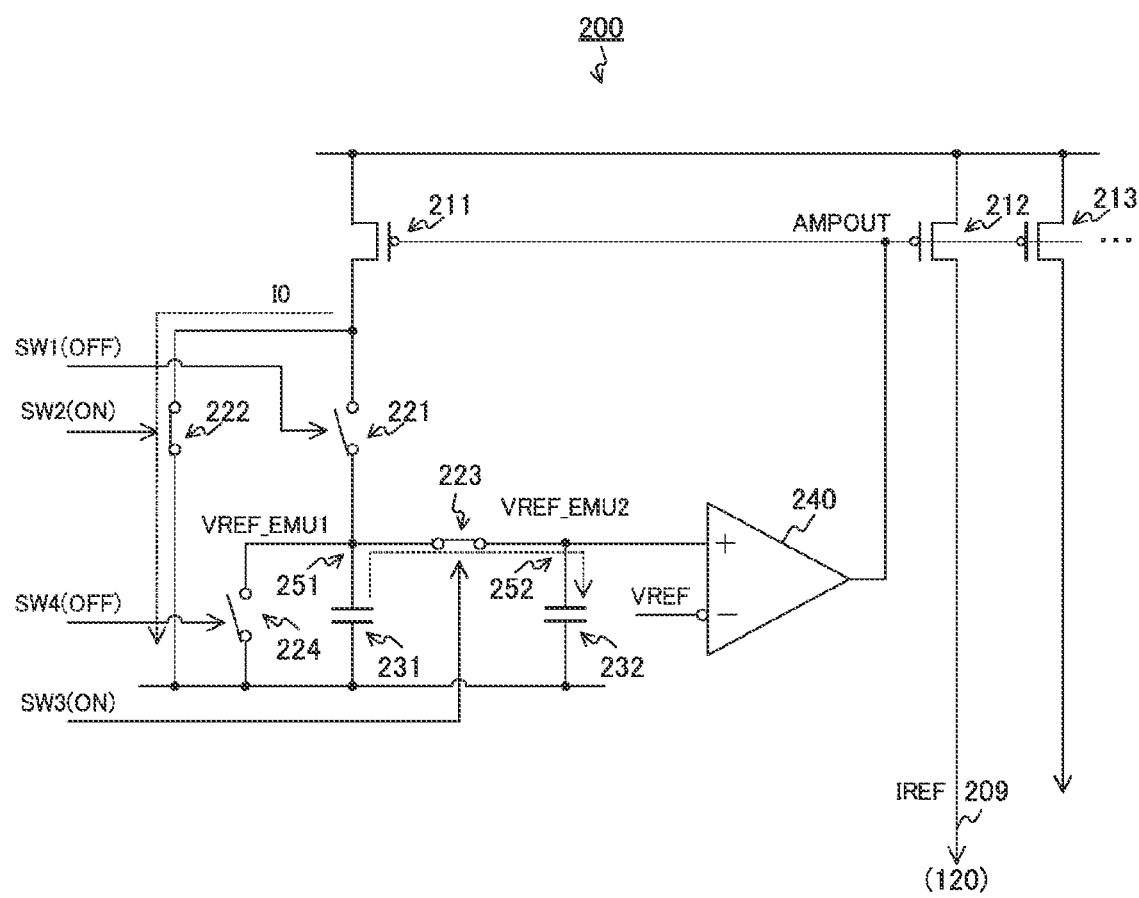
FIG. 5 is a circuit diagram illustrating an example of a state of the current source circuit within a transfer period according to the first embodiment of the present technology.

FIG. 5 is a circuit diagram illustrating an example of the state of the current source circuit 200 within the transfer period according to the first embodiment of the present technology. As illustrated in FIG. 5, the switches 222 and 223 are in the closed state, and the switches 221 and 224 are in the open state. As a result, electric charge accumulated in the capacitor 231 is transferred to the capacitor 232.

Figure 6:
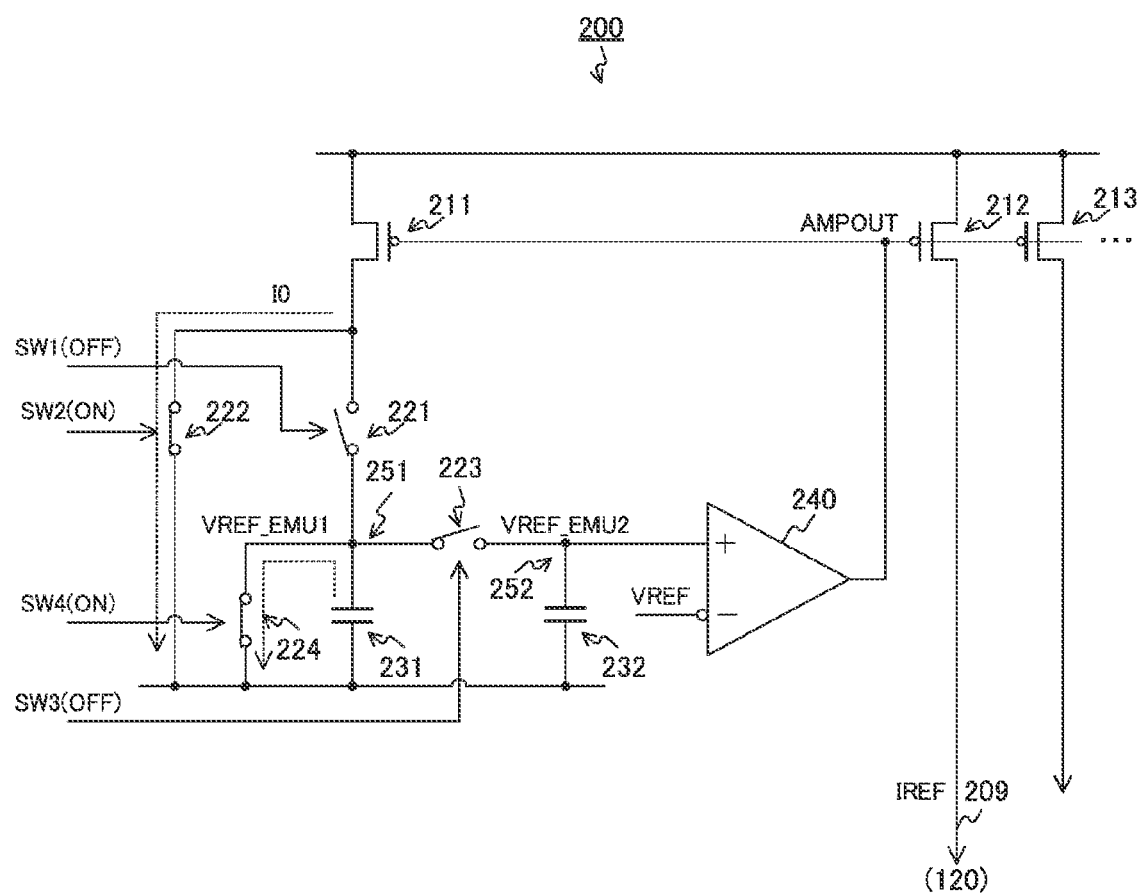
FIG. 6 is a circuit diagram illustrating an example of a state of the current source circuit within a discharge period according to the first embodiment of the present technology.

FIG. 6 is a circuit diagram illustrating an example of the state of the current source circuit 200 within the discharge period according to the first embodiment of the present technology. As illustrated in FIG. 6, the switches 222 and 224 are in the closed state, and the switches 221 and 223 are in the open state. As a result, the capacitor 231 is discharged. In addition, since the switch 222 is in the closed state, the charging current I0 from the pMOS transistor 211 flows to the ground terminal. As a result, it is possible to prevent the drain potential of the pMOS transistor 211 from rapidly rising and the operating point from collapsing. This operation is called a current steering operation.

Figure 7:
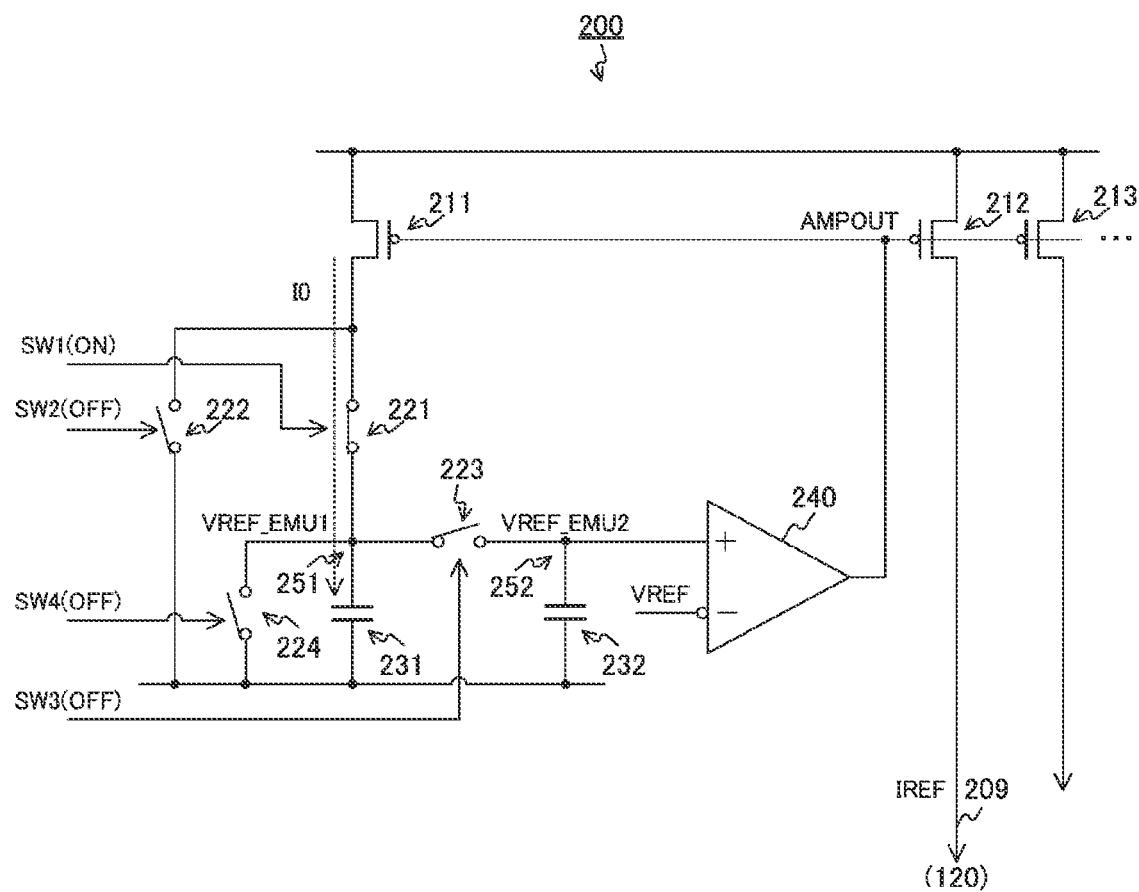
FIG. 7 is a circuit diagram illustrating an example of a state of the current source circuit within a second charge period according to the first embodiment of the present technology.

FIG. 7 is a circuit diagram illustrating an example of the state of the current source circuit 200 within a second charge period according to the first embodiment of the present technology. As illustrated in FIG. 4, only the switch 221 is in the closed state. As a result, the capacitor 231 is charged again.

Figure 8:
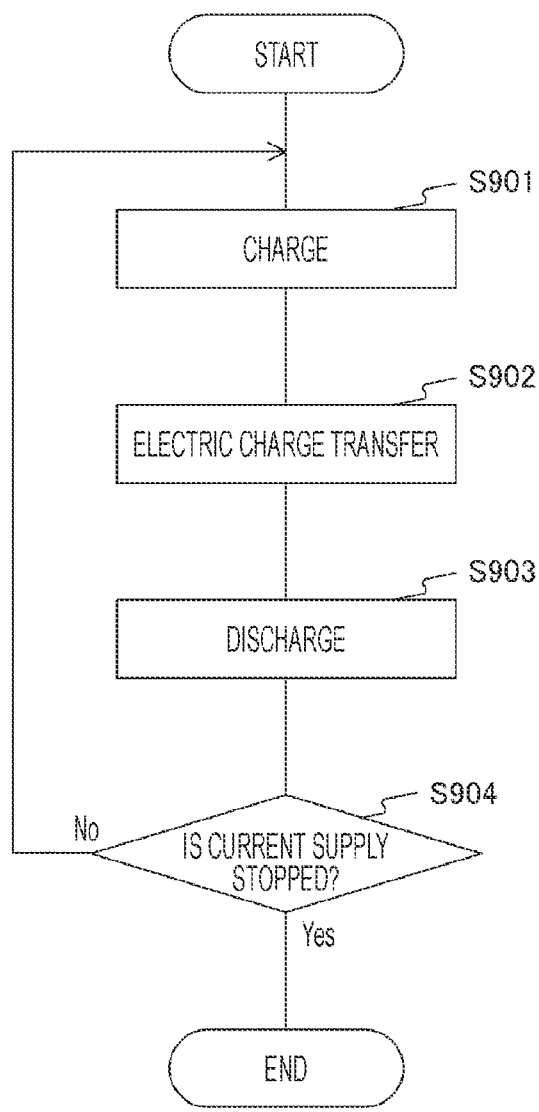
FIG. 8 is a flowchart illustrating an example of operation of the current source circuit according to the first embodiment of the present technology.

FIG. 8 is a flowchart illustrating an example of operation of the current source circuit 200 according to the first embodiment of the present technology. This operation is started at a predetermined timing before the circuit (such as the integrated DAC 120) that receives the reference current IREF operates.

The current source circuit 200 charges the capacitor 231 within a charging period (step S901). Next, the current source circuit 200 transfers electric charge from the capacitor 231 to the capacitor 232 within the transfer period (step S902). Then, the current source circuit 200 charges the capacitor 231 within a discharging period (step S903).

The current source circuit 200 determines whether or not to stop supply of the reference current IREF (step S904). In a case where the supply of the reference current IREF is not stopped (step S904: No), the current source circuit 200 repeats step S901 and the subsequent steps. In contrast, in a case where the supply of the reference current IREF is stopped (step S904: Yes), the current source circuit 200 ends the operation.

[Configuration Example of Integrated DAC]

Figure 9:
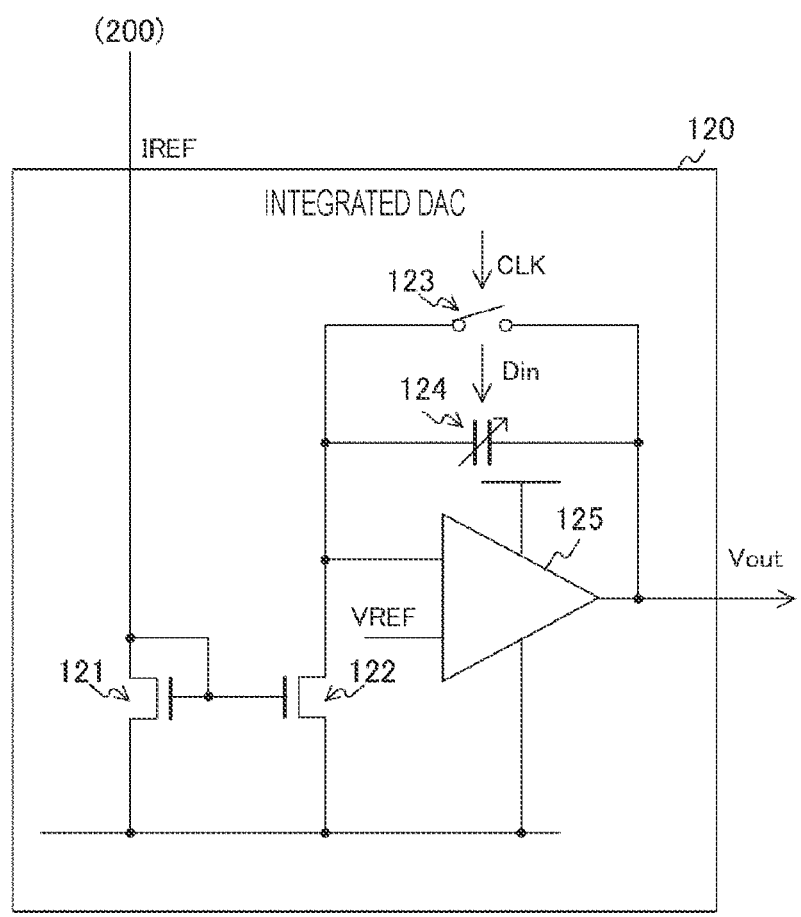
FIG. 9 is a circuit diagram illustrating a configuration example of an integrated digital to analog converter (DAC) according to the first embodiment of the present technology.

FIG. 9 is a circuit diagram illustrating a configuration example of the integrated DAC 120 according to the first embodiment of the present technology. The integrated DAC 120 includes n-channel MOS (nMOS) transistors 121 and 122, a switch 123, a variable capacitor 124, and an operational amplifier 125.

The drain of the nMOS transistor 121 is connected to the current source circuit 200. Furthermore, the drain of the nMOS transistor 121 is also connected to the gate. The source of the nMOS transistor 121 is grounded.

The nMOS transistor 122 is inserted between the input terminal of the operational amplifier 125 and the ground terminal. Furthermore, the gate of the nMOS transistor 122 is connected to the gate of the nMOS transistor 121.

The switch 123 opens and closes a path between the output terminal of the operational amplifier 125 and the drain terminal of the nMOS transistor 122 according to a predetermined clock signal CLK. The clock signal CLK is input over a period during which digital/analog conversion is performed.

The variable capacitor 124 is inserted between the output terminal of the operational amplifier 125 and the drain terminal of the nMOS transistor 122. Furthermore, the capacitance value of the variable capacitor 124 is controlled by a digital signal Din.

One of the two input terminals of the operational amplifier 125 receives the reference voltage VREF, and the other is connected to the drain of the nMOS transistor 122. Furthermore, the operational amplifier 125 outputs a voltage obtained by amplifying the difference between the terminals as an output voltage Vout.

The value of the output voltage Vout is expressed by, for example, the following formula.

$$\text{Vout} = (C_0/C_1) \cdot (dV/dt) \qquad \text{Formula 1}$$

In the above formula, $C_1$ is a capacitance value of the variable capacitor 124, and the unit is, for example, farad (F).

Figure 10:
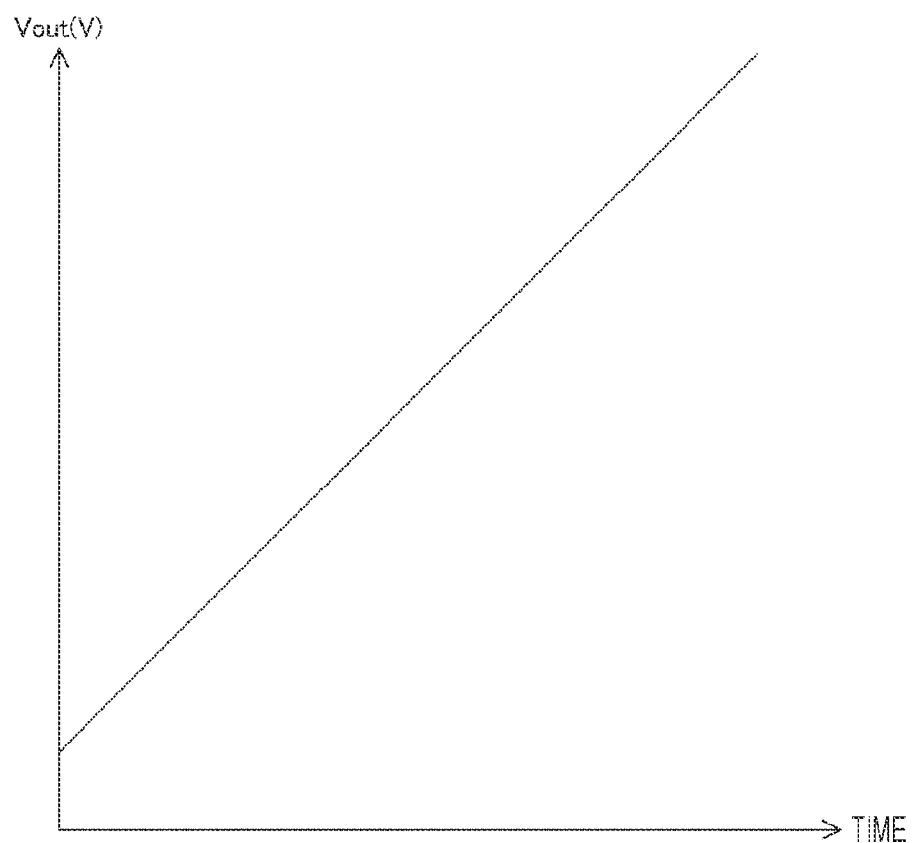
FIG. 10 is a diagram illustrating an example of an output waveform of the integrated DAC according to the first embodiment of the present technology.

FIG. 10 is a diagram illustrating an example of an output waveform of the integrated DAC according to the first embodiment of the present technology. In FIG. 10, the vertical axis represents the output voltage Vout, and the horizontal axis represents time. As illustrated in FIG. 10, the output voltage Vout increases linearly with time.

From Formula 1, the output voltage Vout is determined by the capacitance ratio of $C_0$ and $C_1$, and an arbitrary slope can be obtained by changing the capacitance ratio or the current mirror ratio.

Here, a configuration in which the reference current from the resistance type current source circuit is supplied to the resistance type DAC is assumed as a comparative example. This comparative example has the following problems.

First, as the resolution increases, it is necessary to increase the frequency of the clock signal required for control, and current consumption increases. Second, since the output waveform of the resistance type DAC becomes stepwise, it is necessary to consider an error due to differential nonlinearity (DNL). Third, the output voltage of the resistance type DAC is determined by the ratio of the resistance values of the resistance type current source circuit and the resistance type DAC; however, in general, the error due to resistance mismatch is greater than the error due to capacitance mismatch, and the accuracy of the resistance type DAC becomes low.

In contrast, in a case where the current source circuit 200 using capacitors and the integrated DAC 120 are combined, the value of the output voltage Vout is determined by the capacitance ratio according to Formula 1. This configuration has the following advantages.

First, even if the resolution is increased, since the slope of the output waveform is determined by the current and the capacitance, it is not necessary to increase the frequency of the clock signal, and the current consumption is smaller than that of the comparative example. Second, since the output waveform is not stepwise, there is no problem of error due to DNL. Third, although the value of the output voltage Vout is determined by the capacitance ratio, in general, the error due to the capacitance mismatch is smaller than the error due to the resistance mismatch, and the accuracy of the integrated DAC 120 is higher than that of the comparative example.

As described above, in the current source circuit 200, since the reference current IREF is generated by the capacitors, in a case where the circuit to which the reference current IREF is supplied is a circuit determined by capacitance (integrated DAC or the like), circuit design with extremely high accuracy is possible.

As described above, according to the first embodiment of the present technology, since the switching circuit 220 transfers electric charge to the capacitor 231 after the capacitor 232 is charged, it is possible to suppress the fluctuation (ripple) of the terminal voltage of the capacitor 232. As a result, it is not necessary to add a filter circuit for suppressing the ripple, and there is no possibility that the operational amplifier 240 oscillates due to the capacitor in the filter circuit. Therefore, stability of the current source circuit 200 can be improved.

2. Second Embodiment

In the first embodiment described above, the switching circuit 220 controls electric charge transfer between the capacitors 231 and 232 to reduce a ripple. However, there is a possibility that a ripple on the order of microvolts (μV) remains due to charge injection, parasitic capacitance, or the like at the time of switching. A current source circuit 200 of a second embodiment is different from that of the first embodiment in that an error due to a residual ripple is reduced by using a variable resistor.

Figure 11:
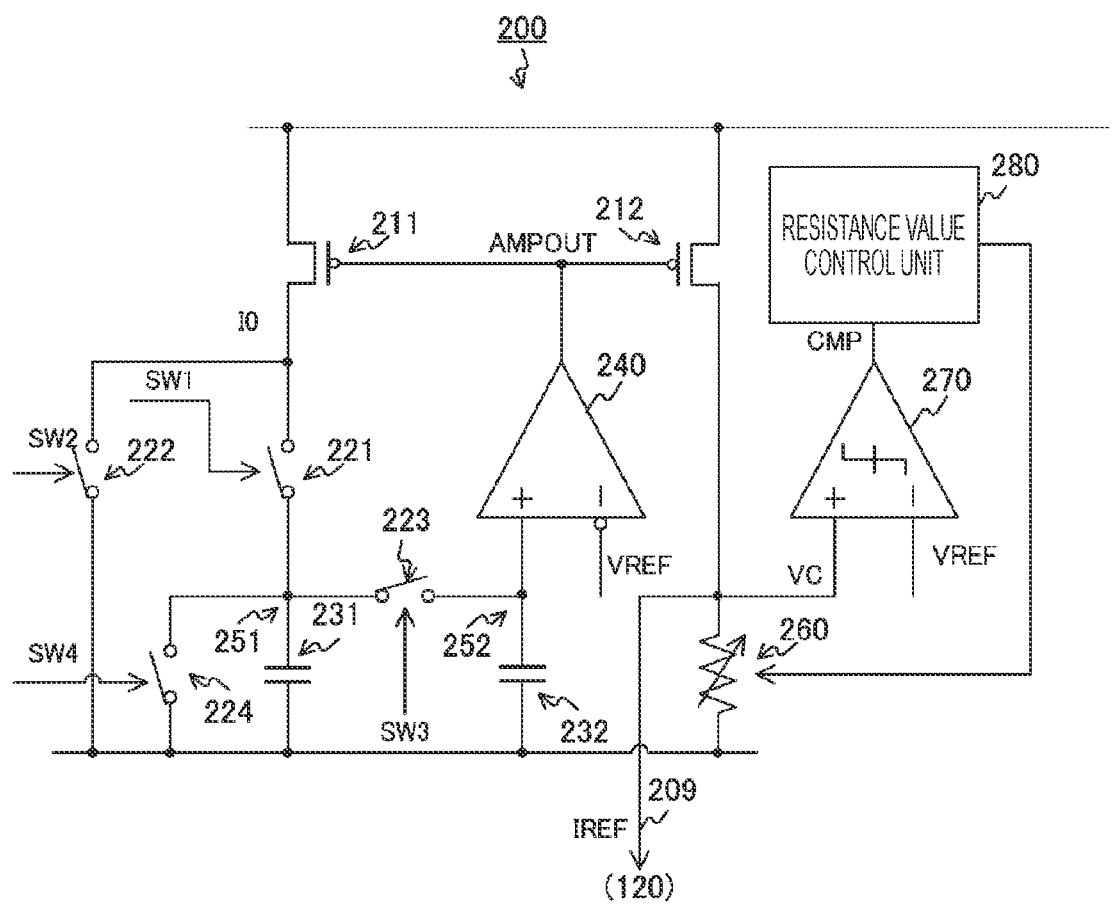
FIG. 11 is a circuit diagram illustrating a configuration example of a current source circuit according to a second embodiment of the present technology.

FIG. 11 is a circuit diagram illustrating a configuration example of the current source circuit 200 of the second embodiment of the present technology. The current source circuit 200 according to the second embodiment is different from that of the first embodiment in further including a variable resistor 260, a comparator 270, and a resistance value control unit 280. Note that, in FIG. 11, a pMOS transistor 213 and subsequent pMOS transistors are omitted.

The variable resistor 260 is connected in series to a pMOS transistor 212 between a power supply terminal and a ground terminal. A reference current IREF is output from a connection node between the pMOS transistor 212 and the variable resistor 260. Furthermore, the voltage VC of the connection node is input to a non-inverting input terminal (+) of the comparator 270.

The comparator 270 compares the voltage VC with a reference voltage VREF and outputs a comparison result CMP to the resistance value control unit 280.

The resistance value control unit 280 controls the resistance value of the variable resistor 260 on the basis of the comparison result CMP. The resistance value control unit 280 determines a resistance value obtained when the voltage VC and the reference voltage VREF substantially match by using, for example, a binary search algorithm.

With the configuration of FIG. 11, it is possible to calibrate the variable resistor 260 so as to correct product variation by using the highly accurate reference current IREF generated by the circuit similar to that of the first embodiment. Then, after the calibration, the control circuit 110 stops the switching circuit 220. As a result, the current source circuit 200 is switched to a resistance type circuit, and an error due to a ripple does not occur.

In order to verify the effect, suppose the product variation of resistors is ±15% and the product variation of capacitors is ±5%. As a result of the calibration, the value of the variable resistor 260 is adjusted to the value of permeation resistance of the circuit including the capacitors 231 and 232 and the switch 223. Therefore, the accuracy after the calibration is ideally improved from ±15% to ±5%. Here, "ideally" is added because accuracy actually decreases by about several % due to a quantization error of the variable resistor 260, mismatch of the comparator 270, or the like.

The resistance value control unit 280 can be easily realized by building a sequencer with a digital circuit, and the algorithm of the calibration is not limited to binary search.

Figure 12:
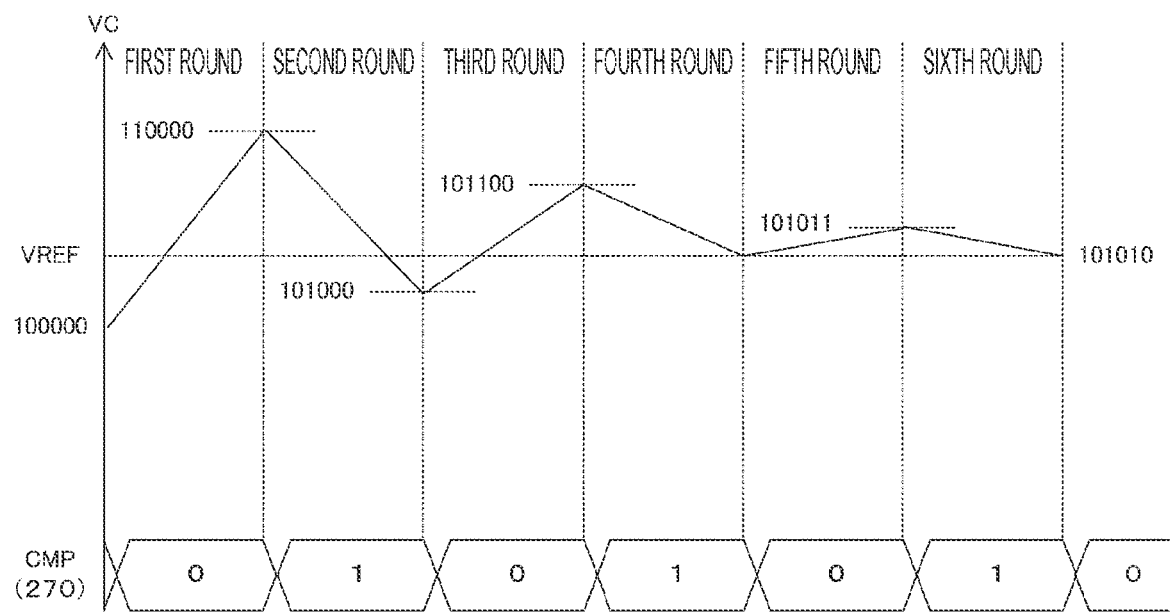
FIG. 12 is a diagram illustrating an example of calibration operation according to the second embodiment of the present technology.

FIG. 12 is a diagram illustrating an example of calibration operation according to the second embodiment of the present technology. In FIG. 12, the vertical axis represents the voltage VC to be controlled, and the horizontal axis represents time.

It is assumed that a control signal is a 6-bit signal, and as a value obtained by converting the 6 bits into a decimal number is larger, the voltage VC is controlled to a higher value (that is, the resistance value of the variable resistor 260 is controlled to a lower value). Furthermore, it is assumed that the comparator 270 outputs "0" as the comparison result CMP in a case where the voltage VC is lower than the reference voltage VREF. In addition, it is assumed that the value at the start of calibration of the voltage VC is a value corresponding to the control signal "100000" ("32" in decimal number).

A value indicated by a dotted line in FIG. 12 indicates the reference voltage VREF. For example, the reference voltage VREF is a value corresponding to the control signal "101010" ("42" in decimal number). In this case, since the voltage VC (32) is lower than the reference voltage VREF (42), the comparator 270 outputs "0" as the first comparison result CMP.

Since the comparison result CMP is "0", the resistance value control unit 280 outputs the control signal "110000" ("48" in decimal number) to increase the voltage VC. As a result, since the voltage VC (48) becomes equal to or higher than the reference voltage VREF (42), the comparator 270 outputs "1" as the first comparison result CMP.

Since the comparison result CMP is "1", the resistance value control unit 280 outputs the control signal "101000" ("40" in decimal number) to decrease the voltage VC. The absolute value of the control amount of the voltage VC in the second round is half of that in the first round. As a result, since the voltage VC (40) is lower than the reference voltage VREF (42), the comparator 270 outputs "0" as the third comparison result CMP.

Since the comparison result CMP is "0", the resistance value control unit 280 outputs the control signal "101100" ("44" in decimal number) to increase the voltage VC. The absolute value of the control amount of the voltage VC in the third round is half of that in the second round. As a result, since the voltage VC (44) becomes equal to or higher than the reference voltage VREF (42), the comparator 270 outputs "1" as the fourth comparison result CMP.

Hereinafter, the resistance value control unit 280 sequentially outputs the control signals "101010", "101011", and "101010" ("42" in decimal number) under similar control. As a result, the resistance value of the variable resistor 260 is calibrated.

Figure 13:
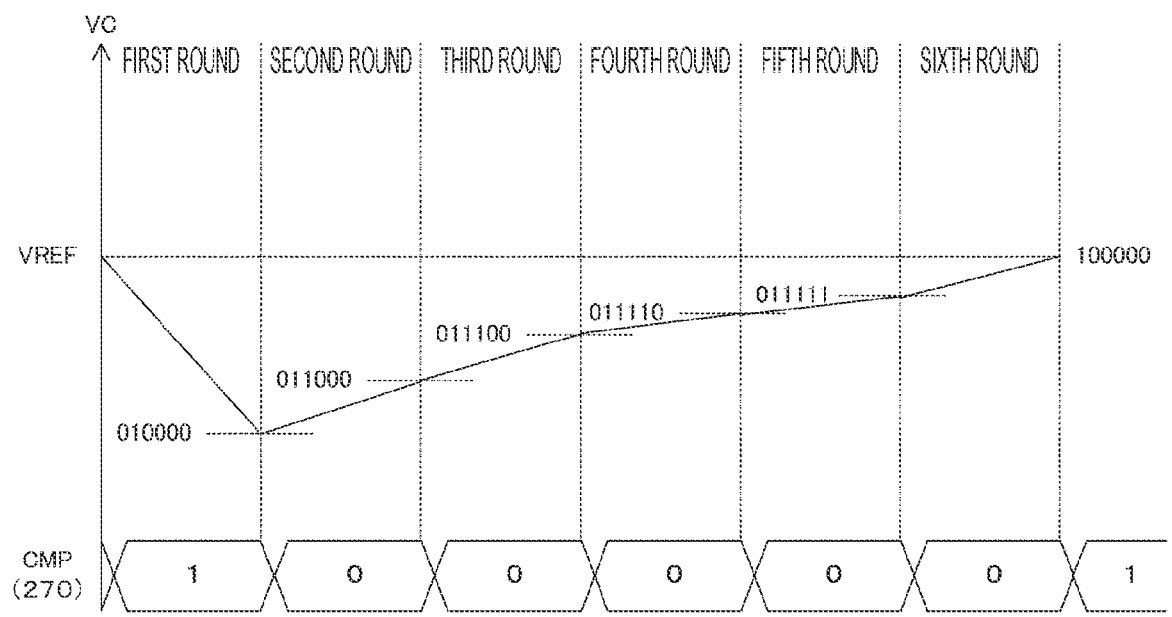
FIG. 13 is a diagram illustrating another example of the calibration operation according to the second embodiment of the present technology.

FIG. 13 is a diagram illustrating another example of the calibration operation according to the second embodiment of the present technology. In this example, the reference voltage VREF is, for example, a value corresponding to the control signal "100000" ("32" in decimal number).

In this case, the resistance value control unit 280 sequentially outputs the control signals "010000", "011000", "011100", "011110", "011111", and "100000" to control the resistance value.

As described above, according to the second embodiment of the present technology, since the resistance value control unit 280 controls the value of the variable resistor 260 to a value at which the voltage VC and the reference voltage substantially match, the current source circuit 200 can output the reference current IREF corresponding to the variable resistor 260. As a result, after the variable resistor 260 is controlled, switching of the switching circuit 220 is stopped, and the ripple can be further suppressed.

Note that the above-described embodiments are examples for embodying the present technology, and a matter in the embodiments and a matter specifying the invention in the claims have a corresponding relationship. Similarly, a matter specifying the invention in the claims and a matter in the embodiments of the present technology, the matter having the same name as the name of the matter specifying the invention have a correspondence relationship. However, the present technology is not limited to the embodiments, and can be embodied by variously modifying the embodiment without departing from the gist thereof.

Note that the effects described in the present Description are illustrations only and not limited, and may have other effects.

Note that the present technology can also be configured as follows.

(1) A current source circuit including:
a pair of capacitors;
a switching circuit that charges one of the pair of capacitors with a predetermined charging current and transfers electric charge from the one of the pair of capacitors to the other of the pair of capacitors;
an operational amplifier that amplifies a difference between a terminal voltage of the other of the pair of capacitors and a predetermined reference voltage and outputs the difference that has been amplified as an output voltage; and an output transistor that outputs a current corresponding to the output voltage as a reference current.

(2) The current source circuit according to the (1), in which
the switching circuit further performs control to discharge one of the pair of capacitors.

(3) The current source circuit according to the (2), in which
the switching circuit alternately performs control to charge the one of the pair of capacitors and control to transfer the electric charge to the other of the pair of capacitors and discharge the one of the pair of capacitors.

(4) The current source circuit according to any one of the (1) to (3) further including
a current source transistor that supplies a current corresponding to the output voltage as the charging current.

(5) The current source circuit according to the (4), in which the switching circuit includes:
a first switch that opens and closes a path between the current source transistor and one of the pair of capacitors;
a second switch that opens and closes a path between a predetermined ground terminal and a connection node between the current source transistor and the one of the pair of capacitors;
a third switch that opens and closes a path between the pair of capacitors; and
a fourth switch that opens and closes a path between the ground terminal and a connection node between the first switch and the one of the pair of capacitors.

(6) The current source circuit according to any one of the (1) to (5) further including:
a variable resistor that is connected in series to the output transistor;
a comparator that compares a voltage of a connection node between the output transistor and the variable resistor with the reference voltage and outputs a comparison result; and
a resistance value control unit that controls a resistance value of the variable resistor on the basis of the comparison result.

(7) The current source circuit according to the (6), in which
the resistance value control unit determines the resistance value obtained when a voltage of the connection node of the variable resistor and the reference voltage substantially match by using a binary search algorithm.

(8) An electronic device including:
a pair of capacitors;
a switching circuit that charges one of the pair of capacitors with a predetermined charging current and transfers electric charge from the one of the pair of capacitors to the other of the pair of capacitors;
an operational amplifier that amplifies a difference between a terminal voltage of the other of the pair of capacitors and a predetermined reference voltage and outputs the difference that has been amplified as an output voltage;
an output transistor that outputs a current corresponding to the output voltage as a reference current; and
a reception circuit that receives the reference current and operates.

(9) The electronic device according to the (8), in which
the reception circuit is an integrated digital-to-analog converter.

REFERENCE SIGNS LIST

100 Electronic device
110 Control circuit
120 Integrated DAC
121, 122 nMOS transistor
123, 221 to 224 Switch
124 Variable capacitor
125, 240 Operational amplifier
200 Current source circuit
211 to 213 pMOS transistor
220 Switching circuit
231, 232 Capacitor
260 Variable resistor
270 Comparator
280 Resistance value control unit

The invention claimed is:

1. A current source circuit, comprising:
 a pair of capacitors;
 a switching circuit that charges one of the pair of capacitors with a predetermined charging current and transfers electric charge from the one of the pair of capacitors to another of the pair of capacitors;
 an operational amplifier that amplifies a difference between a terminal voltage of the other of the pair of capacitors and a predetermined reference voltage and outputs the difference that has been amplified as an output voltage; and
 an output transistor that outputs a current corresponding to the output voltage as a reference current.

2. The current source circuit according to claim 1, wherein the switching circuit further performs control to discharge one of the pair of capacitors.

3. The current source circuit according to claim 2, wherein the switching circuit alternately performs control to charge the one of the pair of capacitors and control to transfer the electric charge to the other of the pair of capacitors and discharge the one of the pair of capacitors.

4. The current source circuit according to claim 1, further comprising
 a current source transistor that supplies a current corresponding to the output voltage as the charging current.

5. The current source circuit according to claim 4, wherein the switching circuit includes:
 a first switch that opens and closes a path between the current source transistor and one of the pair of capacitors;
 a second switch that opens and closes a path between a predetermined ground terminal and a connection node between the current source transistor and the one of the pair of capacitors;
 a third switch that opens and closes a path between the pair of capacitors; and
 a fourth switch that opens and closes a path between the ground terminal and a connection node between the first switch and the one of the pair of capacitors.

6. The current source circuit according to claim 1, further comprising:
 a variable resistor that is connected in series to the output transistor;
 a comparator that compares a voltage of a connection node between the output transistor and the variable resistor with the reference voltage and outputs a comparison result; and
 a resistance value control unit that controls a resistance value of the variable resistor on a basis of the comparison result.

7. The current source circuit according to claim 6, wherein the resistance value control unit determines the resistance value obtained when a voltage of the connection node of the variable resistor and the reference voltage substantially match by using a binary search algorithm.

8. An electronic device, comprising:
 a pair of capacitors;
 a switching circuit that charges one of the pair of capacitors with a predetermined charging current and transfers electric charge from the one of the pair of capacitors to another of the pair of capacitors;
 an operational amplifier that amplifies a difference between a terminal voltage of the other of the pair of capacitors and a predetermined reference voltage and outputs the difference that has been amplified as an output voltage;
 an output transistor that outputs a current corresponding to the output voltage as a reference current; and
 a reception circuit that receives the reference current and operates.

9. The electronic device according to claim 8, wherein the reception circuit is an integrated digital-to-analog converter.

* * * * *